(12) United States Patent
Lim et al.

(10) Patent No.: US 9,590,149 B2
(45) Date of Patent: Mar. 7, 2017

(54) LIGHTING EMITTING DEVICE

(71) Applicant: Seoul Semiconductor Co., Ltd., Ansan-si (KR)

(72) Inventors: Michael Lim, Ansan-si (KR); Hyuck Jung Choi, Ansan-si (KR); Kwang Yong Oh, Ansan-si (KR); Myung Jin Kim, Ansan-si (KR); Ki Bum Nam, Ansan-si (KR); Sang Shin Park, Ansan-si (KR); Ji Youn Oh, Ansan-si (KR)

(73) Assignee: SEOUL SEMICONDUCTOR CO., LTD., Ansan-si (KR)

( * ) Notice: Subject to any disclaimer, the term of this patent is extended or adjusted under 35 U.S.C. 154(b) by 18 days.

(21) Appl. No.: 14/624,383

(22) Filed: Feb. 17, 2015

(65) Prior Publication Data

US 2016/0104820 A1    Apr. 14, 2016

Related U.S. Application Data

(60) Provisional application No. 62/062,532, filed on Oct. 10, 2014, provisional application No. 62/091,157, filed on Dec. 12, 2014, provisional application No. 62/091,176, filed on Dec. 12, 2014.

(30) Foreign Application Priority Data

| Nov. 20, 2014 | (KR) | 10-2014-0162638 |
|---|---|---|
| Nov. 20, 2014 | (KR) | 10-2014-0162639 |
| Jan. 16, 2015 | (KR) | 10-2015-0008214 |
| Jan. 20, 2015 | (KR) | 10-2015-0009481 |
| Feb. 9, 2015 | (KR) | 10-2015-0019551 |
| Feb. 9, 2015 | (KR) | 10-2015-0019553 |

(51) Int. Cl.
*H01L 33/50* (2010.01)
*C09K 11/77* (2006.01)

(52) U.S. Cl.
CPC ........ *H01L 33/504* (2013.01); *C09K 11/7734* (2013.01); *C09K 11/7739* (2013.01); *C09K 11/7774* (2013.01); *H01L 33/502* (2013.01)

(58) Field of Classification Search
CPC ....................................................... H01L 33/26
See application file for complete search history.

(56) References Cited

U.S. PATENT DOCUMENTS

2013/0221873 A1* 8/2013 Weaver ................. H05B 33/10
                                                                315/294

* cited by examiner

*Primary Examiner* — Daniel Whalen
*Assistant Examiner* — Suberr Chi
(74) *Attorney, Agent, or Firm* — Perkins Coie LLP

(57) ABSTRACT

A light emitting device is disclosed. The light emitting device includes: a light emitting diode emitting light having a peak wavelength in the range of 415 nm to 435 nm; and a wavelength conversion unit disposed on the light emitting diode, wherein the wavelength conversion unit includes cyan phosphors emitting light having a peak wavelength in a cyan light wavelength band and red phosphors emitting light having a peak wavelength in a red light wavelength band, and a ratio of an output of light having a wavelength in the range of 435 nm to 465 nm to a total output of light emitted from the light emitting device is approximately equal to or less than 3%.

17 Claims, 6 Drawing Sheets

(a)

(b)

(c)

(d)

(a)

(b)

(c)

(d)

LIGHTING EMITTING DEVICE

PRIORITY CLAIMS AND CROSS-REFERENCES TO RELATED APPLICATIONS

This application claims priority and benefits of Korean Patent Application No. 10-2014-0162638 filed on Nov. 20, 2014, No. 10-2014-0162639 filed on Nov. 20, 2014, No. 10-2015-0008214 filed on Jan. 16, 2015, No. 10-2015-0009481 filed on Jan. 20, 2015, No. 10-2015-0019551 filed on Feb. 9, 2015 and No. 10-2015-00019553 filed on Feb. 9, 2015, the contents of which are hereby incorporated by reference in their entirety. This application claims priority benefits of U.S. provisional patent application No. 62/062,532 filed Oct. 10, 2014, No. 62/091,175 filed on Dec. 12, 2014 and No. 62/091,176 filed on Dec. 12, 2014, the contents of which are hereby incorporated by reference in their entirety.

FIELD OF THE INVENTION

The present invention relates to a light emitting device, and more particularly, to a light emitting device having high reliability and high color rendering.

BACKGROUND

A light emitting diode generally emits light having a peak wavelength of a narrow full width at half maximum and thus requires a plurality of active layers, which emit light in various wavelength bands, in order to realize white light. However, such a light emitting diode including a plurality of active layers provides very low fabrication efficiency for technical and process reasons. Accordingly, in order to realize a while light emitting device using a light emitting diode, the light emitting device further employs phosphors that excite light emitted from the light emitting diode into light having a different wavelength band than that of the emitted light. As a result, white light can be obtained through combination of light emitted from the light emitting diode and light excited by the phosphors.

For example, phosphors, which absorb part of blue light as excitation light to emit yellow green light or yellow light, can be deposited onto a blue light emitting diode to obtain white light. However, since a white light emitting diode package with this structure employs luminescence of yellow phosphors, the white light emitting diode package has low color rendering and low color reproducibility due to depletion of spectrum in green and red wavelength regions of light emitted therefrom. Accordingly, this type of light emitting device has a limit in application to the field of illumination or display. To overcome such a problem, a light emitting diode is fabricated using a blue light emitting diode chip and phosphors that emit green light and red light using blue light as excitation light. That is, it is possible to realize white light having a high color rendering index through combination of blue light with green light and red light excited by the blue light.

However, for a conventional light emitting device using a blue light emitting diode chip, blue light having a peak wavelength of about 450 nm has relatively high intensity. The blue light having such a peak wavelength can cause various malfunctions such as deterioration of eyesight or sleep disturbance, and the like. In Particular, the blue light emitting diode applied to lighting apparatuses and the like can cause severe problems.

In order to realize white light, a UV light emitting diode chip can be used instead of the blue light emitting diode chip. However, since the UV light emitting diode chip emits light of wavelengths having relatively high energy, there can be problems of decomposition of an encapsulation material, discoloration and deterioration of a lead frame, and the like. In addition, although the encapsulation material can be prepared using materials (for example, methyl silicon) that exhibit relatively high resistance to UV light, such materials have low mechanical reliability due to high hardness. Moreover, UV light emitted from the UV light emitting diode is not favorable to humans or animals.

SUMMARY

An object of the present invention is to provide a light emitting device that can prevent suppression of melatonin biosynthesis or insomnia.

Another object of the present invention is to provide a light emitting device that has improved reliability and color rendering index.

In accordance with one aspect of the present invention, a light emitting device includes: a light emitting diode emitting light having a peak wavelength in the range of 415 nm to 435 nm; and a wavelength conversion unit disposed on the light emitting diode, wherein the wavelength conversion unit includes cyan phosphors emitting light having a peak wavelength in a cyan light wavelength band and red phosphors emitting light having a peak wavelength in a red light wavelength band, and a ratio of an output of light having a wavelength in the range of 435 nm to 465 nm to a total output of light emitted from the light emitting device is approximately equal to or less than 3%.

The cyan phosphors can include at least one of LuAG, YAG, nitride and silicate-based phosphors.

The red phosphors can include at least one of CASN, CASON and SCASN phosphors.

In some embodiments, the cyan phosphors can emit light having a peak wavelength in the range of 500 nm to 540 nm, and the red phosphors can include first red phosphors emitting light having a peak wavelength in the range of 610 nm to 630 nm and second red phosphors emitting light having a peak wavelength in the range of 640 nm to 650 nm.

The cyan phosphors can include phosphors represented by $Lu_xAl_yO_z$:Ce, the first red phosphors can include phosphors represented by $(Sr,Ca)_xAl_ySi_zN_w$:Eu, and the second red phosphors can include phosphors represented by $Ca_xAl_ySi_zN_w$:Eu.

The light emitting device can emit light having a CRI of 90 or more, and a mass ratio of the cyan phosphors to the red phosphors in the wavelength conversion unit can be (from 7 to 24):1 (cyan phosphors:red phosphors).

In the red phosphors, a mass ratio of the first red phosphor to the second red phosphor can be (from 0.5 to 9):1 (first red phosphors:second red phosphors).

In some embodiments, the light emitting device can emit light having a CRI of 95 or more, and a mass ratio of the cyan phosphors to the red phosphors in the wavelength conversion unit can be (from 3 to 13):1 (cyan phosphors:red phosphors).

In the red phosphors, a mass ratio of the first red phosphor to the second red phosphor can be 1:(from 2 to 4) (first red phosphors:second red phosphors).

The cyan phosphors can include phosphors represented by $Lu_3Al_5O_{12}$:Ce, the first red phosphors can include phosphors represented by $(Sr,Ca)_1Al_1Si_1N_3$:Eu, and the second red phosphors can include phosphors represented by $Ca_1Al_1Si_1N_3$:Eu.

A ratio of an output of light having a wavelength in the range of 435 nm to 465 nm to a total output of light emitted from the light emitting device can be approximately equal to or less than 2%.

In some embodiments, the wavelength conversion unit can further include blue phosphors emitting light having a peak wavelength in a blue light wavelength band.

The blue phosphors can emit light having a peak wavelength in the range of 450 nm to 480 nm, the cyan phosphors can emit light having a peak wavelength in the range of 500 nm to 540 nm, and the red phosphors can emit light having a peak wavelength in the range of 610 nm to 630 nm.

The blue phosphors can include phosphors represented by $(Sr,Ba)_x(PO_y)_zCl_w$:Eu, the cyan phosphors can include phosphors represented by $Lu_xAl_yO_z$:Ce, and the red phosphors can include phosphors represented by $(Sr,Ca)_xAl_ySi_zN_w$:Eu.

The light emitting device can emit light having a CRI of 90 or more, and the phosphors in the wavelength conversion unit can be present in a mass ratio satisfying $((Sr,Ba)_x(PO_y)_zCl_w$:Eu$):(Lu_xAl_yO_z$:Ce and/or $Lu_x(Al,Ga)_yO_z$:Ce$)):((Sr,Ca)_xAl_ySi_zN_w$:Eu$)=$(from 1 to 4):(from 6 to 9):(from 0.2 to 1).

The light emitting device can emit light having a CRI of 95 or more, and the phosphors in the wavelength conversion unit can be present in a mass ratio satisfying $((Sr,Ba)_x(PO_y)_zCl_w$:Eu$):((Lu_xAl_yO_z$:Ce and/or $Lu_x(Al,Ga)_yO_z$:Ce$)):(Ca_xAl_ySi_z(ON)_w$:Eu$)=$(from 1 to 6):(from 2 to 7):(from 0.5 to 4).

The blue phosphors can include phosphors represented by $(Sr,Ba)_{10}(PO_4)_6Cl_2$:Eu, the cyan phosphors can include phosphors represented by $Lu_3Al_5O_{12}$:Ce and/or $Lu_3(Al,Ga)_5O_{12}$:Ce, and the red phosphors can include phosphors represented by $Ca_1Al_1Si_1(ON)_3$:Eu.

In accordance with another aspect of the present invention, a light emitting device includes: a light emitting diode emitting light having a peak wavelength in the range of 415 nm to 435 nm; and a wavelength conversion unit disposed on the light emitting diode, wherein the wavelength conversion unit includes green phosphors emitting light having a peak wavelength in a green light wavelength band through conversion of light incident thereon and red phosphors emitting light having a peak wavelength in a red light wavelength band through conversion of light incident thereon; the green phosphors include first green phosphors emitting light having a peak wavelength in the range of 500 nm to 520 nm and second green phosphors emitting light having a peak wavelength in the range of 530 nm to 550 nm through conversion of light incident thereon; and light emitted from the light emitting device has a CRI of 90 or more and an R9 value of 50 or more.

The first green phosphors can be LuAG-based phosphors and the second green phosphors can be silicate-based phosphors.

The red phosphors can include first red phosphors emitting light having a peak wavelength in the range of 600 nm to 630 nm and second red phosphors emitting light having a peak wavelength in the range of 630 nm to 650 nm.

The green phosphors and the red phosphors can be mixed in a mass ratio of the green phosphors to the red phosphors of (from 3 to 18):1.

A mass ratio of the first green phosphors to the second green phosphors can be 9:1 and a mass ratio of the first red phosphors to the second red phosphors can be 4:6.

The light emitting device according to the present invention is fabricated using a light emitting diode, which emits light having a peak wavelength in a shorter wavelength band than a blue light wavelength band of light emitted from a conventional light emitting diode, thereby minimizing problems such as suppression of melatonin biosynthesis or insomnia caused by light in the blue light wavelength band.

In addition, the light emitting device according to the present invention can realize white light having high color rendering index while guaranteeing thermal and mechanical reliability. Further, the light emitting device according to the present invention does not suffer from deterioration in reliability due to UV light, thereby preventing deterioration of color rendering index upon use of the light emitting device. Furthermore, the light emitting device according to the present invention has improved CRI and luminous intensity as compared with a conventional light emitting device.

DETAILED DESCRIPTION

Figure 1:
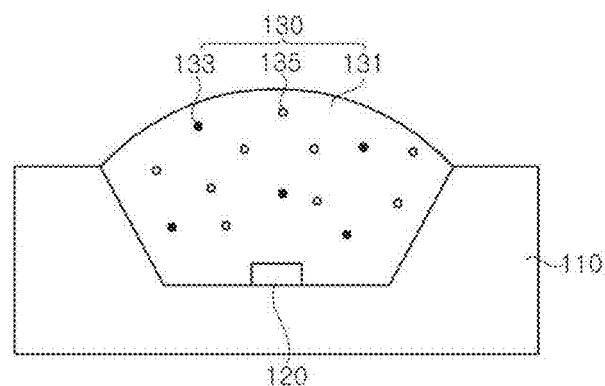
FIG. 1 is a sectional view of a light emitting device according to one embodiment of the present invention.

Hereinafter, embodiments of the present invention will be described in detail with reference to the accompanying drawings. The following embodiments are provided by way of example so as to fully convey the spirit of the present invention to those skilled in the art to which the present invention pertains. Accordingly, the present invention is not limited to the embodiments disclosed herein and can also be implemented in different forms. In the drawings, widths, lengths, thicknesses, and the like of elements can be exaggerated for clarity and descriptive purposes. When an element or layer is referred to as being "disposed above" or "disposed on" another element or layer, it can be directly "disposed above" or "disposed on" the other element or layer or intervening elements or layers can be present. Throughout the specification, like reference numerals denote like elements having the same or similar functions.

FIG. 1 is a sectional view of a light emitting device according to one embodiment of the present invention.

Referring to FIG. 1, the light emitting device includes a light emitting diode 120 and a wavelength conversion unit 130, and can further include a base 110.

In this embodiment, the light emitting diode 120 can be disposed on the base 110. The base 110 can be, for example, a housing, as shown in FIG. 1.

The housing can include a cavity open at an upper side thereof and the light emitting diode 120 can be mounted in the cavity. The cavity can be formed to have an inclined side surface, whereby light emitted from the light emitting diode 120 is reflected from the inclined side surface of the cavity, thereby improving luminous efficiency of the light emitting device according to this embodiment of the invention. In addition, a reflective material can be disposed on the inner side surface of the cavity.

When the base 110 is the housing, the housing can be formed of general plastic materials including polymers, ABS (acrylonitrile butadiene styrene), LCP (liquid crystalline polymer), PA (polyamide), PPS (polyphenylene sulfide) or TPE (thermoplastic elastomer), or metal or ceramic materials. It should be understood that the present invention is not limited thereto.

Further, the base 110 can include at least two lead terminals, which can be electrically connected to the light emitting diode 120. The light emitting device can be connected to an external power source through the lead terminals. The light emitting diode 120 can be disposed on the lead terminals.

The base 110 is not limited thereto and can have any configuration well known in the art so long as the base is configured to support the light emitting diode 120. For example, the base 110 can include a conductive or insulating substrate, or a printed circuit board (PCB) on which the light emitting diode 120 will be mounted, and can further include a heat sink through which heat generated from the light emitting diode 120 can be discharged.

The light emitting diode 120 can include an n-type semiconductor layer and a p-type semiconductor layer such that light can be emitted through recombination of holes and electrons. The light emitting diode 120 can have a lateral type, a vertical type or a flip-chip type structure, and is not limited to a particular configuration and shape.

The light emitting diode 120 can emit light having a peak wavelength in the visible light wavelength region. For example, the light emitting diode 120 can emit light having a peak wavelength in the range of 400 nm to 435 nm, specifically in the range of 415 nm to 435 nm, more specifically in the range of 420 nm to 430 nm. Further, although the peak wavelength of light emitted from the light emitting diode 120 can have a full width at half maximum (FWHM) of 40 nm or less, the present invention is not limited thereto. The light emitting device according to this embodiment includes the light emitting diode 120 that emits light having a peak wavelength in the aforementioned range, thereby preventing deterioration in reliability and luminous efficiency of the light emitting device due to UV light emitted from the light emitting diode, while minimizing negative effects on the human body through minimization of light at a wavelength of about 450 nm.

The wavelength conversion unit 130 can be disposed on the light emitting diode 120 and can at least partially cover the light emitting diode 120. Furthermore, the wavelength conversion unit 130 can encapsulate the light emitting diode 120. That is, the wavelength conversion unit 330 can be disposed on a light exit path of the light emitting diode 120.

The wavelength conversion unit 130 can include a containing portion 131, and cyan phosphors 133 and red phosphors 135 irregularly dispersed in the containing portion 131. In this embodiment, the wavelength conversion unit 130 can be free from blue phosphors.

The containing portion 131 can be formed of any material capable of containing the cyan phosphors 133 and the red phosphors 135, and can be transparent or translucent. The containing portion 131 can be formed of a polymer material including at least one selected from among, for example, a silicone resin, an epoxy resin, a polymethyl methacrylate (PMMA) resin, a polyethylene (PE) resin, and a polystyrene (PS) resin. Alternatively, the containing portion 131 can be formed of an inorganic material such as glass.

When the containing portion 131 is formed of a polymer material, the wavelength conversion unit 130 serves to convert the wavelength of light emitted from the light emitting diode 120 while encapsulating the light emitting diode 120. In addition, the wavelength conversion unit 130 can be disposed on the base 110, and when the base 110 includes the cavity as in this embodiment, the wavelength conversion unit 130 can be placed within the cavity. Furthermore, an upper surface of the wavelength conversion unit 130 can be formed in a variety of shapes, such as a convex lens shape, a flat shape (not shown), a shape having a convex-concave pattern on a surface thereof, and the like. Although the wavelength conversion unit 130 is illustrated as having a convex lens-shaped upper surface in this embodiment, the present invention is not limited thereto.

The cyan phosphors 133 and the red phosphors 135 can be irregularly dispersed in the containing portion 131. In addition, the cyan phosphors 133 and the red phosphors 135 can emit light having different peak wavelengths.

Specifically, the cyan phosphors 133 can emit cyan light through excitation of light incident thereon and the red phosphors 135 can emit red light through excitation of light incident thereon. As a result, the light emitting device according to the present invention can emit white light through combination of violet light emitted from the light emitting diode 120, the cyan light excited by the cyan phosphors 133, and the red light excited by the red phosphors 135.

Further, the spectrum of white light emitted from the light emitting device according to this embodiment cannot include a light component having a peak wavelength in a wavelength band of 440 nm to 460 nm. In addition, a ratio of an output of light having a wavelength in the range of about 435 nm to 465 nm to a total output of the white light emitted from the light emitting device can be approximately equal to or less than 3%, preferably, approximately equal to or less than 2%. That is, the light emitting device according to this embodiment can minimize the intensity of light having a wavelength in the range of about 435 nm to 465, thereby minimizing or preventing suppression of melatonin biosynthesis by light emitted therefrom. Thus, it is possible to reduce negative effects on products using the light emitting device according to this embodiment.

Figure 13:
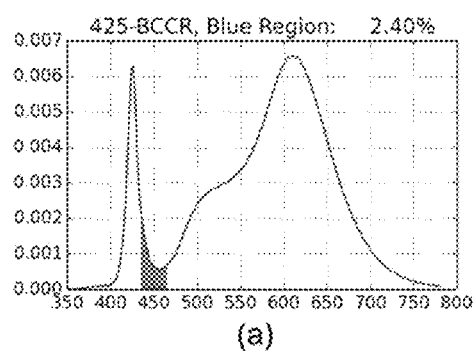
FIG. 13 shows graphs depicting spectra of light emitted from the light emitting devices according to the embodiments of the present invention.
Figure 13:
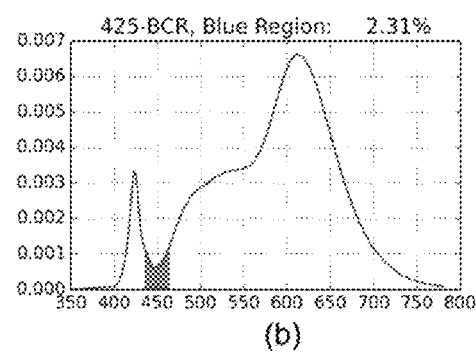
Figure 13:
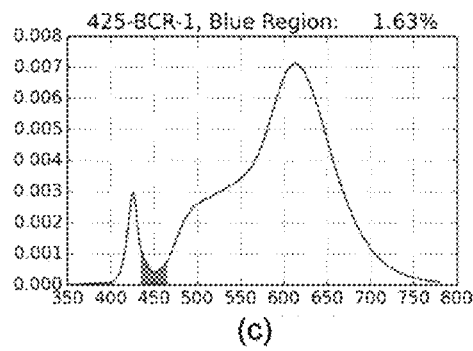
Figure 13:
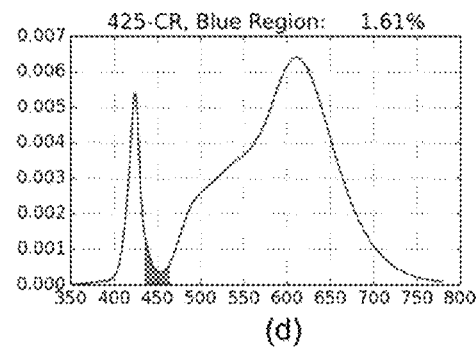

For example, FIG. 13 (a) to (d) show luminescence spectra of light emitting devices each prepared using a light emitting diode emitting light having a peak wavelength of 425 nm and phosphors. FIG. 13(a) shows a luminescence spectrum of a light emitting device, which includes a light emitting diode emitting light having a peak wavelength of 425 nm, and a wavelength conversion unit including blue phosphors, first cyan phosphors, second cyan phosphors and red phosphors. FIG. 13(b) shows a luminescence spectrum of a light emitting device, which includes a light emitting diode emitting light having a peak wavelength of 425 nm, and a wavelength conversion unit including blue phosphors, cyan phosphors and first red phosphors. FIG. 13(c) shows a luminescence spectrum of a light emitting device, which includes a light emitting diode emitting light having a peak wavelength of 425 nm, and a wavelength conversion unit including blue phosphors, cyan phosphors and second red phosphors. FIG. 13(d) shows a luminescence spectrum of a light emitting device which includes a light emitting diode emitting light having a peak wavelength of 425 nm and a wavelength conversion unit including cyan phosphors and red phosphors.

As shown in the spectra of FIGS. 13(a) to (d), the ratio of an output of light in a blue light wavelength band (light having a wavelength in the range of about 435 nm to about 465 nm) to the total output of light emitted from the light emitting devices according to the embodiments of the present invention can be approximately equal to or less than 3%, preferably, approximately equal to or less than 2%.

The white light emitted from the light emitting device according to this embodiment can have a CRI of 70 or more, specifically a CRI of 90 or more, more specifically a CRI of 95 or more. This range of the CRI can be obtained by adjusting the mixing ratio of the cyan phosphors 133 to the red phosphors 135, as described in more detail below.

The cyan light emitted from the cyan phosphors 133 can have a peak wavelength in the range of 500 nm to 540 nm. The cyan phosphors 133 can include at least one selected from among LuAG-based phosphors, YAG-based phosphors, β-SiAlON phosphors, nitride-based phosphors, and silicate-based phosphors, without being limited thereto. The red light emitted from the red phosphors 135 can have a peak wavelength in the range of 600 nm to 660 nm, and can include at least two kinds of phosphors emitting light having different peak wavelengths. The red phosphors 135 can include nitride-based phosphors represented by CASN, CASON and SCASN, without being limited thereto.

First, the light emitting device according to this embodiment can have a CRI of 90 or more.

Here, the cyan phosphors 133 can include LuAG-based phosphors. The LuAG-based phosphors can include phosphors represented by $Lu_xAl_yO_z$:Ce and/or $Lu_x(Al,Ga)_yO_z$:Ce. More specifically, the LuAG-based phosphors can include phosphors represented by $Lu_3Al_5O_{12}$:Ce and/or $Lu_3(Al,Ga)_5O_{12}$:Ce. The red phosphors 135 can include first red phosphor emitting light having a peak wavelength in the range of 610 nm to 630 nm and second red phosphors emitting light having a peak wavelength in the range of 640 nm to 650 nm. The first red phosphors can include phosphors represented by $(Sr,Ca)_xAl_ySi_zN_w$:Eu, and the second red phosphors can include phosphors represented by $Ca_xAl_ySi_zN_w$:Eu. More specifically, the first red phosphors can include phosphors represented by $(Sr,Ca)_1Al_1Si_1N_3$:Eu, and the second red phosphors can include phosphors represented by $Ca_1Al_1Si_1N_3$:Eu.

Figure 4:
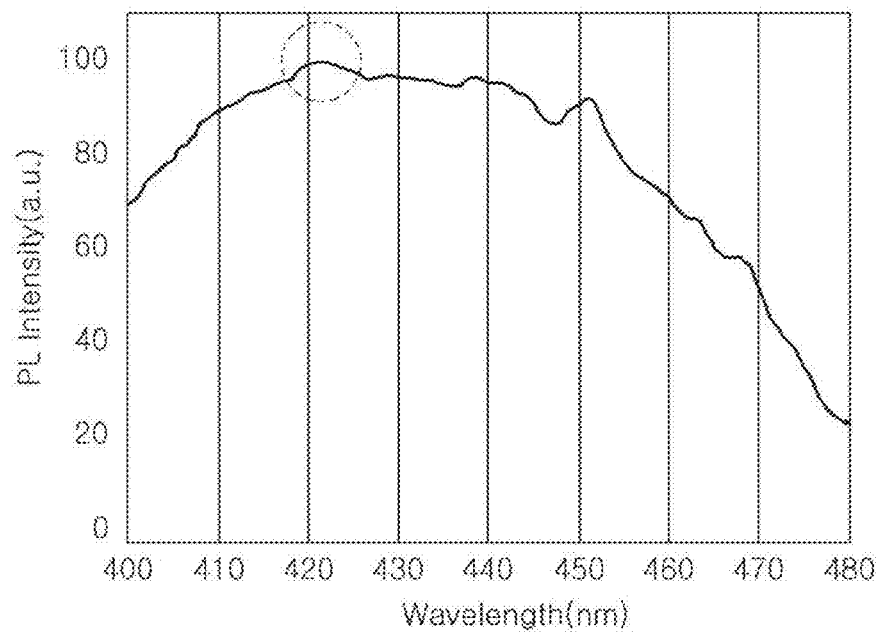
FIG. 4 is a graph depicting an excitation spectrum of cyan phosphors depending upon wavelengths of a light emitting diode, from which the wavelength band of the light emitting diode used in a white light emitting device according to one embodiment of the present invention can be confirmed.

Particularly, the light emitting device including the LuAG-based phosphors as the cyan phosphors can have improved luminous intensity. FIG. 4 is a graph depicting an excitation spectrum of LuAG-based phosphors depending upon wavelengths of a light emitting diode. In FIG. 4, it can be seen that the LuAG-based phosphor has the highest photoluminescence intensity with respect to light having a wavelength in the range of 415 nm to 435 nm. Accordingly, the light emitting device according to this embodiment includes the light emitting diode 120, which emits light having a peak wavelength in the range of 415 nm to 435 nm, thereby providing improved luminescence intensity.

The mixing ratio of the cyan phosphors 133 to the red phosphors 135 can be adjusted such that the light emitting device according to this embodiment has a CRI of 90 or more. For example, the cyan phosphors 133 and the red phosphors 135 can be mixed in a mass ratio of (from 7 to 24):1 (cyan phosphors 133:red phosphors 135). In addition, the mixing ratio of the first red phosphors to the second red phosphors can be adjusted such that the light emitting device according to this embodiment has a CRI of 90 or more. For example, the first red phosphors and the second red phosphors can be mixed in a mass ratio of (from 0.5 to 9):1 (first red phosphors:second red phosphors).

In addition, the light emitting device according to this embodiment can have a CRI of 95 or more.

Here, the cyan phosphors 133 can include LuAG-based phosphors. The LuAG-based phosphors can include phosphors represented by $Lu_xAl_yO_z$:Ce and/or $Lu_x(Al,Ga)_yO_z$:Ce. More specifically, the LuAG-based phosphors can include $Lu_3Al_5O_{12}$:Ce and/or $Lu_3(Al,Ga)_5O_{12}$:Ce. The red phosphors 135 can include first red phosphors emitting light having a peak wavelength in the range of 610 nm to 630 nm and second red phosphors emitting light having a peak wavelength in the range of 640 nm to 650 nm. The first red phosphors can include phosphors represented by $(Sr,Ca)_xAl_ySi_zN_w$:Eu, and the second red phosphors can include phosphors represented by $Ca_xAl_ySi_zN_w$:Eu. More specifically, the first red phosphors can include phosphors represented by $(Sr,Ca)_1Al_1Si_1N_3$:Eu, and the second red phosphors can include phosphors represented by $Ca_1Al_1Si_1N_3$:Eu.

The mixing ratio of the cyan phosphors 133 to the red phosphors 135 can be adjusted such that the light emitting device according to this embodiment has a CRI of 95 or more. For example, the cyan phosphors 133 and the red phosphors 135 can be mixed in a mass ratio of (from 3 to 13):1 (cyan phosphors:red phosphors). In addition, the mixing ratio of the first red phosphors to the second red phosphors can be adjusted such that the light emitting device according to this embodiment has a CRI of 95 or more. For example, the first red phosphors and the second red phosphors can be mixed in a mass ratio of 1:(from 2 to 4) (first red phosphors:second red phosphors).

In another embodiment, the mixing ratio of the cyan phosphors 133 to the red phosphors 135 can be adjusted such that the light emitting device according to this embodiment has a CRI of 90 or more and an R9 value of about 45 or more. For example, the cyan phosphors 133 can include LuAG-based phosphors. The LuAG-based phosphors can include phosphors represented by $Lu_x(Al,Ga)_yO_z$:Ce. More specifically, the LuAG-based phosphors can include $Lu_3(Al,Ga)_5O_{12}$:Ce. The red phosphors 135 can include CASN phosphors. The CASN phosphors can include phosphors represented by $(Sr,Ca)_xAl_ySi_zN_w$:Eu. More specifically, the CASN phosphors can include $(Sr,Ca)_1Al_1Si_1N_3$:Eu. The cyan phosphors 133 to the red phosphors 135 can be mixed in a mass ratio of (from 10 to 30):1 (cyan phosphors:red phosphors), specifically (from 16 to 27):1.

In a further embodiment, the red phosphors 135 can include red phosphors emitting light having a relatively long-wavelength and red phosphors emitting light having a relatively short-wavelength. In this embodiment, the red phosphors emitting light having a short-wavelength region can be $(Sr,Ca)_xAl_ySi_zN_w$ phosphors and can further include europium (Eu). For example, the red phosphors emitting light having a short-wavelength can be $(Sr,Ca)_1Al_1Si1N_3$:Eu phosphors. In addition, the red phosphors emitting light having a long-wavelength can be $Ca_xAl_ySi_zN_w$:Eu phosphors, for example, $Ca_1Al_1Si_1N_3$:Eu phosphors. The ratio of the red phosphors emitting light having a short-wavelength to the red phosphors emitting light having a long-wavelength can be, for example, 4:6, without being limited thereto.

Generally, blue phosphors are vulnerable to high temperature, causing undesirable variation of luminous characteristics (color temperature, color rendering index, and the like) and deterioration of luminous efficiency of the light emitting device, thereby deteriorating optical reliability and lifespan of the light emitting device. However, according to the embodiments of the invention described above, the light emitting device does not include the blue phosphors and thus can prevent deterioration in reliability and lifespan thereof while guaranteeing a CRI of 90 or more, specifically a CRI of 95 or more.

In addition, the light emitting device includes at least two kinds of red phosphors 135 having different peak wavelengths, thereby realizing a higher CRI than conventional light emitting devices using red phosphors having a narrow full width at half maximum. Further, the aforementioned red phosphors exhibit excellent resistance to high temperature, thereby preventing deterioration in reliability, luminous intensity and lifespan of the light emitting device due to heat emitted therefrom.

Experimental Example 1

In order to measure CRIs and luminous intensity of the light emitting devices according to the embodiments of the present invention, the CRIs and the luminous intensity were measured and compared using a white light emitting device (Example 1) employing a light emitting diode emitting light having a peak wavelength of 425 nm and a white light emitting device (Comparative Example 1) employing a light emitting diode emitting light having a peak wavelength of 450 nm. The light emitting devices of Example 1 and Comparative Example 1 were operated at a current of 100 mA under the same conditions, and results are shown in Table 1.

TABLE 1

| Light emitting device | Peak wavelength of light emitting diode (λ) | Phosphor | | PKG | | |
|---|---|---|---|---|---|---|
| | | Green (cyan) | Red | Flux (lm) | CCT (K) | CRI |
| Comparative Example 1 | 450 nm | LuAG (Wp = 540 nm) + YAG | Nitride phosphors (Wp = 648 nm) | 65.9 (100%) | 2700 | 92 |
| Example 1 | 425 nm | LuAG (Wp = 540 nm) | Nitride phosphors (Wp = 626 nm) | 70.2 (107%) | 2772 | 92 |

From Table 1, it can be seen that the light emitting device according to the present invention has improved luminous efficiency and prevents decrease in CRI, as compared with the light emitting device employing a conventional light emitting diode (blue light emitting diode emitting light having a peak wavelength of 450 nm).

Experimental Example 2

In order to measure CRIs and luminous intensity of the light emitting devices according to the embodiments of the present invention, the CRIs and the luminous intensity of the light emitting devices were measured and compared while changing the peak wavelengths of the light emitting diodes. The light emitting devices prepared in Example 1 and Comparative Examples 1 and 2 were operated at a current of 100 mA under the same conditions, and results are shown in Table 2.

TABLE 2

| | Peak wavelength of light emitting diode (λ) | CIE x | CIE y | L/F (lm) | ΔL/F (%) | CRI |
|---|---|---|---|---|---|---|
| Comparative Example 1 | 408 nm | 0.44 | 0.407 | 28.1 | 100.00% | 88.2 |
| Comparative Example 2 | 413 nm | 0.435 | 0.412 | 31.3 | 111.40% | 90.6 |
| Example 1 | 425 nm | 0.426 | 0.394 | 34 | 121.00% | 93.2 |

As can be seen from Table 2, the light emitting device of Example 1 had the highest CRI and the highest luminous intensity. Therefore, it can be seen that the white light emitting device according to one embodiment of the invention, which employs the light emitting diode emitting light having a peak wavelength in the range of 410 nm to 435 nm, can improve both CRI and luminous intensity.

Experimental Example 3

The CRTs of the light emitting devices according to the embodiments of the present invention were measured and the following experimental result was obtained. In Examples 1 to 4, light emitting devices including wavelength conversion units having different mixing ratios of cyan phosphors to red phosphors were prepared. The light emitting devices of Examples 1 to 4 had different mixing ratios of the phosphors, and in Experimental Example 3, the mixing ratio refers to a mass ratio.

Specifically, the light emitting device of Example 1 includes a light emitting diode emitting light having a peak wavelength of about 425 nm and a wavelength conversion unit that encapsulates the light emitting diode and includes $Lu_3(Al,Ga)_5O_{12}:Ce$ as the cyan phosphors and $(Sr,Ca)_1Al_1Si_1N_3:Eu$ and $Ca_1Al_1Si_1N_3:Eu$ as the red phosphors. In this example, the cyan phosphors and the red phosphors were mixed in a mass ratio of 17:1 ($(Lu_3(Al,Ga)_5O_{12}:Ce)$:red phosphors), and the red phosphors were mixed in a mass ratio of 3:1 ($(Sr,Ca)_1Al_1Si_1N_3:Eu:Ca_1Al_1Si_1N_3:Eu$).

The light emitting device of Example 2 includes a light emitting diode emitting light having a peak wavelength of about 425 nm and a wavelength conversion unit that encapsulates the light emitting diode and includes $Lu_3(Al,Ga)_5O_{12}:Ce$ as the cyan phosphors and $(Sr,Ca)_1Al_1Si_1N_3:Eu$ and $Ca_1Al_1Si_1N_3:Eu$ as the red phosphors. In this example, the cyan phosphors and the red phosphors were mixed in a mass ratio of 20:1 (($Lu_3(Al,Ga)_5O_{12}$:Ce):red phosphors), and the red phosphors were mixed in a mass ratio of 9:1 (($Sr,Ca)_1Al_1Si_1N_3$:Eu:$Ca_1Al_1Si_1N_3$:Eu).

The light emitting device of Example 3 includes a light emitting diode emitting light having a peak wavelength of about 425 nm and a wavelength conversion unit that encapsulates the light emitting diode and includes $Lu_3(Al,Ga)_5O_{12}$:Ce as the cyan phosphors and $(Sr,Ca)_1Al_1Si_1N_3$:Eu and $Ca_1Al_1Si_1N_3$:Eu as the red phosphors. In this example, the cyan phosphors and the red phosphors were mixed in a mass ratio of 12:1 (($Lu_3(Al,Ga)_5O_{12}$:Ce):red phosphors), and the red phosphors were mixed in a mass ratio of 3:7 (($Sr,Ca)_1Al_1Si_1N_3$:Eu:$Ca_1Al_1Si_1N_3$:Eu).

The light emitting device of Example 4 includes a light emitting diode emitting light having a peak wavelength of about 425 nm and a wavelength conversion unit that encapsulates the light emitting diode and includes $Lu_3(Al,Ga)_5O_{12}$:Ce as the cyan phosphors and $(Sr,Ca)_1Al_1Si_1N_3$:Eu and $Ca_1Al_1Si_1N_3$:Eu as the red phosphors. In this example, the cyan phosphors and the red phosphors were mixed in a mass ratio of 5:1 (($Lu_3(Al,Ga)_5O_{12}$:Ce):red phosphors), and the red phosphors were mixed in a mass ratio of 2:8 (($Sr,Ca)_1Al_1Si_1N_3$:Eu:$Ca_1Al_1Si_1N_3$:Eu).

The light emitting devices of Examples 1 to 4 are identical to one another except for the mixing ratio of the phosphors and results obtained by operating these light emitting devices at a current of 100 mA under the same conditions are shown in Table 3.

TABLE 3

| Light emitting device | Mixing ratio (mass ratio) | CRI |
|---|---|---|
| Example 1 | $Lu_3(Al,Ga)_5O_{12}$:Ce:(($Sr,Ca)_1Al_1Si_1N_3$:Eu,$Ca_1Al_1Si_1N_3$:Eu) = 17:1 <br> $(Sr,Ca)_1Al_1Si_1N_3$:Eu:$Ca_1Al_1Si_1N_3$:Eu = 3:1 | 91.2 |
| Example 2 | $Lu_3(Al,Ga)_5O_{12}$:Ce:(($Sr,Ca)_1Al_1Si_1N_3$:Eu,$Ca_1Al_1Si_1N_3$:Eu) = 20:1 <br> $(Sr,Ca)_1Al_1Si_1N_3$:Eu:$Ca_1Al_1Si_1N_3$:Eu = 9:1 | 90.9 |
| Example 3 | $Lu_3(Al,Ga)_5O_{12}$:Ce:(($Sr,Ca)_1Al_1Si_1N_3$:Eu,$Ca_1Al_1Si_1N_3$:Eu) = 12:1 <br> $(Sr,Ca)_1Al_1Si_1N_3$:Eu:$Ca_1Al_1Si_1N_3$:Eu = 3:7 | 93.4 |
| Example 4 | $Lu_3(Al,Ga)_5O_{12}$:Ce:(($Sr,Ca)_1Al_1Si_1N_3$:Eu,$Ca_1Al_1Si_1N_3$:Eu) = 5:1 <br> $(Sr,Ca)_1Al_1Si_1N_3$:Eu:$Ca_1Al_1Si_1N_3$:Eu = 2:8 | 95.4 |

As such, according to the embodiments of the present invention, the light emitting devices do not include blue phosphors and thus exhibit high reliability with respect to heat while guaranteeing a high CRI of 90 or more, specifically 95 or more.

Figure 2:
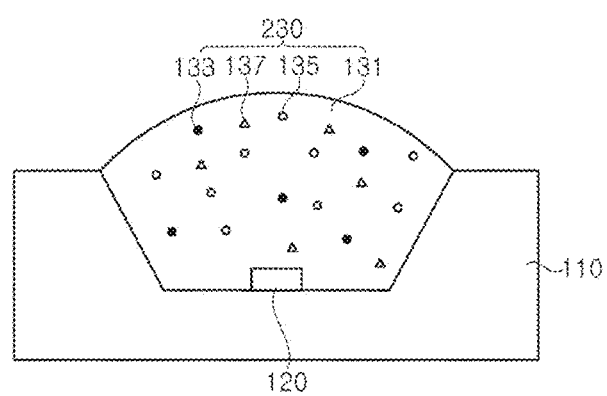
FIG. 2 is a sectional view of a light emitting device according to another embodiment of the present invention.

FIG. 2 is a sectional view of a light emitting device according to an embodiment of the present invention. The light emitting device of FIG. 2 is substantially the same as the light emitting device of FIG. 1 except for a wavelength conversion unit 230. The following description provides different features of the light emitting device according to this embodiment from those of the above embodiment, and detailed descriptions of the same features are omitted.

Referring to FIG. 2, the light emitting device according to this embodiment includes a light emitting diode 120 and the wavelength conversion unit 230, and can further include a base 110.

The wavelength conversion unit 230 can include a containing portion 131, and cyan phosphors 133, red phosphors 135, and blue phosphors 137, which are irregularly dispersed in the containing portion 131.

The containing portion 131 can be formed of any material capable of containing the cyan phosphors 133 and the red phosphors 135, and can be transparent or translucent. The containing portion 131 can be formed of a polymer material including at least one selected from among, for example, a silicone resin, an epoxy resin, a polymethyl methacrylate (PMMA) resin, a polyethylene (PE) resin, and a polystyrene (PS) resin. Alternatively, the containing portion 131 can be formed of an inorganic material such as glass.

When the containing portion 131 is formed of a polymer material, the wavelength conversion unit 230 serves to convert the wavelength of light emitted from the light emitting diode 120 while encapsulating the light emitting diode 120. In addition, the wavelength conversion unit 130 can be disposed on the base 110, and when the base 110 includes the cavity as in this embodiment, the wavelength conversion unit 230 can be placed within the cavity. Furthermore, an upper surface of the wavelength conversion unit 130 can be formed in a variety of shapes, such as a convex lens shape, a flat shape (not shown), a shape having a convex-concave pattern on a surface thereof, and the like. Although the wavelength conversion unit 230 is illustrated as having a convex lens-shaped upper surface in this embodiment, the present invention is not limited thereto.

The cyan phosphors 133, the red phosphors 135 and the blue phosphors 137 can be irregularly dispersed within the containing portion 131.

Specifically, the cyan phosphors 133 can emit cyan light through excitation of light incident thereon, the red phosphors 135 can emit red light through excitation of light incident thereon, and the blue phosphors 137 can emit blue light through excitation of light incident thereon. As a result, the light emitting device according to the present invention can emit white light through combination of violet light emitted from the light emitting diode 120, the cyan light excited by the cyan phosphors 133, the red light excited by the red phosphors 135, and the blue light excited by the blue phosphors 137.

Further, the spectrum of white light emitted from the light emitting device according to this embodiment can not include a light component having a peak wavelength in a wavelength band of 440 nm to 460 nm. In addition, a ratio of an output of light having a wavelength in the range of about 435 nm to 465 nm to a total output of the white light emitted from the light emitting device can be approximately equal to or less than 3%. That is, the light emitting device according to this embodiment can minimize the intensity of light having a wavelength in the range of about 435 nm to 465, thereby minimizing or preventing suppression of melatonin biosynthesis by light emitted therefrom. Thus, it is possible to reduce negative effects on products using the light emitting device according to this embodiment.

The white light emitted from the light emitting device according to this embodiment can have a CRI of 70 or more, specifically a CRI of 90 or more, more specifically a CRI of 95 or more. This range of the CRI can be obtained by adjusting the mixing ratio between the cyan phosphors 133, the red phosphors 135 and the blue phosphors 137, as described in more detail below.

The cyan light emitted from the cyan phosphors 133 can have a peak wavelength in the range of 500 nm to 540 nm. The cyan phosphors 133 can include at least one selected from among LuAG-based phosphors, YAG-based phosphors, β-SiAlON phosphors, nitride-based phosphors, and silicate-based phosphors, without being limited thereto. The red light emitted from the red phosphors 135 can have a peak wavelength in the range of 600 nm to 660 nm, and can include at least two kinds of phosphors emitting light having different peak wavelengths. The red phosphors 135 can include nitride-based phosphors represented by CASN, CASON and SCASN, without being limited thereto. The blue light emitted from the blue phosphors 137 can have a peak wavelength in the range of 450 nm to 480 nm, specifically in the range of 465 nm to 480 nm. The blue phosphors 137 can include at least one selected from among SBCA-based phosphors, BAM (Ba—Al—Mg)-based phosphors, silicate-based phosphors, and nitride-based phosphors, without being limited thereto.

First, the light emitting device according to this embodiment can have a CRI of 90 or more.

Here, the blue phosphors 137 can include phosphors emitting light having a peak wavelength in the range of 450 nm to 480 nm. For example, the blue phosphors 137 can include phosphors represented by $(Sr,Ba)_x(PO_y)_zCl_w:Eu$, more specifically $(Sr,Ba)_{10}(PO_4)_6Cl_2:Eu$.

The cyan phosphors 133 can include LuAG-based phosphors. The LuAG-based phosphors can include phosphors represented by $Lu_xAl_yO_z:Ce$ and/or $Lu_x(Al,Ga)_yO_z:Ce$. More specifically, the LuAG-based phosphors can include phosphors represented by $Lu_3Al_5O_{12}:Ce$ and/or $Lu_3(Al,Ga)_5O_{12}:Ce$.

The red phosphors 135 can include phosphors emitting light having a peak wavelength in the range of 610 nm to 660 nm, specifically in the range of 610 nm to 630 nm. For example, the red phosphors 135 can include phosphors which emits light having a peak wavelength in the range of 610 nm to 630 nm and are represented by $(Sr,Ca)_xAl_ySi_zN_w:Eu$. More specifically, the red phosphors 135 can include phosphors represented by $(Sr,Ca)_1Al_1Si_1N_3:Eu$.

The mixing ratio of the cyan phosphors 133, the red phosphors 135 and the blue phosphors 137 can be adjusted such that the light emitting device according to this embodiment has a CRI of 90 or more. For example, the cyan phosphors 133, the red phosphors 135 and the blue phosphors 137 can be mixed in a mass ratio of (from 1 to 4):(from 6 to 9):(from 0.2 to 1) (blue phosphors:cyan phosphors:red phosphors).

In addition, the light emitting device according to this embodiment can have a CRI of 95 or more.

In this case, the blue phosphors 137 can include phosphors emitting light having a peak wavelength in the range of 450 nm to 480 nm. For example, the blue phosphors 137 can include phosphors represented by $(Sr,Ba)_x(PO_y)_zCl_w:Eu$, more specifically $(Sr,Ba)_{10}(PO_4)_6Cl_2:Eu$.

The cyan phosphors 133 can include LuAG-based phosphors. The LuAG-based phosphors can include phosphors represented by $Lu_xAl_yO_z:Ce$ and/or $Lu_x(Al,Ga)_yO_z:Ce$. More specifically, the LuAG-based phosphors can include phosphors represented by $Lu_3Al_5O_{12}:Ce$ and/or $Lu_3(Al,Ga)_5O_{12}:Ce$.

The red phosphors 135 can include phosphors emitting light having a peak wavelength in the range of 610 nm to 660 nm, specifically in the range of 630 nm to 640 nm. For example, the red phosphors 135 can include phosphors which emit light having a peak wavelength in the range of 630 nm to 640 nm and are represented by $Ca_xAl_ySi_z(ON)_w:Eu$. More specifically, the red phosphors 135 can include phosphors represented by $Ca_1Al_1Si_1(ON)_3:Eu$.

The mixing ratio of the cyan phosphors 133, the red phosphors 135 and the blue phosphors 137 can be adjusted such that the light emitting device according to this embodiment has a CRI of 95 or more. For example, the cyan phosphors 133, the red phosphors 135 and the blue phosphors 137 can be mixed in a mass ratio of (from 1 to 6):(from 2 to 7):(from 0.5 to 4) (blue phosphors:cyan phosphors:red phosphors).

According to the embodiments of the invention, the mixing ratio of the phosphors included in the wavelength conversion unit 230 of the light emitting device is adjusted such that the light emitting device can emit light having a CRI of 90 or more, furthermore, 95 or more. In addition, the light emitting device emits white light through conversion of wavelengths of light emitted from the light emitting diode, which emits light having a peak wavelength in the range of 415 nm to 430 nm, using the phosphors to prevent damage to the light emitting device by UV light. Accordingly, the light emitting device can prevent deterioration in luminous intensity and color rendering index caused by extended operation of the light emitting device.

Experimental Example 4

The CRIs of the light emitting devices according to the embodiments of the present invention were measured and the following experimental result was obtained. In Examples 1 to 4, light emitting devices including wavelength conversion units having different mixing ratios of cyan phosphors, red phosphors and blue phosphors were prepared. The light emitting devices of Examples 1 to 4 have different mixing ratios of the phosphors, and in Experimental Example 4, the mixing ratio refers to a mass ratio.

Specifically, the light emitting device of Example 1 includes a light emitting diode emitting light having a peak wavelength of about 425 nm and a wavelength conversion unit that encapsulates the light emitting diode and includes $Lu_3(Al,Ga)_5O_{12}:Ce$ as the cyan phosphors, $(Sr,Ca)_1Al_1Si_1N_3:Eu$ as the red phosphors, and $(Sr,Ba)_{10}(PO_4)_6Cl_2:Eu$ as the blue phosphors. In this example, the blue phosphors, the cyan phosphors and the red phosphors were mixed in a mass ratio of 1.0:8.55:0.45 $((Sr,Ba)_{10}(PO_4)_6Cl_2:Eu:Lu_3(Al,Ga)_5O_{12}:Ce:(Sr,Ca)_1Al_1Si_1N_3:Eu)$.

Each of the light emitting devices of Examples 2 to 4 includes a light emitting diode emitting light having a peak wavelength of about 425 nm and a wavelength conversion unit that encapsulates the light emitting diode and includes $Lu_3(Al,Ga)_5O_{12}:Ce$ as the cyan phosphors, $Ca_1Al_1Si_1(ON)_3:Eu$ as the red phosphors, and $(Sr,Ba)_{10}(PO_4)_6Cl_2:Eu$ as the blue phosphors. Here, the light emitting device samples have different mixing ratios of the blue phosphors, the cyan phosphors and the red phosphors. For the light emitting device of Example 2, $((Sr,Ba)_{10}(PO_4)_6Cl_2:Eu:Lu_3(Al,Ga)_5O_{12}:Ce:(Sr,Ca)_1Al_1Si_1N_3:Eu)$ was set to 4.0:3.9:2.1; for the light emitting device of Example 3, $((Sr,Ba)_{10}(PO_4)_6Cl_2:Eu:Lu_3(Al,Ga)_5O_{12}:Ce:(Sr,Ca)_1Al_1Si_1N_3:Eu)$ was set to 3.0:4.5:2.5; and for the light emitting device of Example 4, $((Sr,Ba)_{10}(PO_4)_6Cl_2:Eu:Lu_3(Al,Ga)_5O_{12}:Ce:(Sr,Ca)_1Al_1Si_1N_3:Eu)$ was set to 2.0:5.3:2.7.

The light emitting devices of Examples 1 to 4 are identical to one another except for the mixing ratio of the phosphors and results obtained by operating these light emitting devices at a current of 100 mA under the same conditions are shown in Table 4.

TABLE 4

| Light emitting device | Mixing ratio (mass ratio) | CRI |
|---|---|---|
| Example 1 | $(Sr,Ba)_{10}(PO_4)_6Cl_2:Eu:Lu_3(Al,Ga)_5O_{12}:Ce:(Sr,Ca)_1Al_1Si_1N_3:Eu = 1.0:8.55:0.45$ | 91.5 |
| Example 2 | $(Sr,Ba)_{10}(PO_4)_6Cl_2:Eu:Lu_3(Al,Ga)_5O_{12}:Ce:Ca_1Al_1Si_1(ON)_3:Eu = 4.0:3.9:2.1$ | 97.3 |
| Example 3 | $(Sr,Ba)_{10}(PO_4)_6Cl_2:Eu:Lu_3(Al,Ga)_5O_{12}:Ce:Ca_1Al_1Si_1(ON)_3:Eu = 3.0:4.5:2.5$ | 95.8 |
| Example 4 | $(Sr,Ba)_{10}(PO_4)_6Cl_2:Eu:Lu_3(Al,Ga)_5O_{12}:Ce:Ca_1Al_1Si_1(ON)_3:Eu = 2.0:5.3:2.7$ | 94.6 |

As such, the embodiments of the present invention provide light emitting devices having a CRI of 90 or more, specifically 95 or more.

Figure 3:
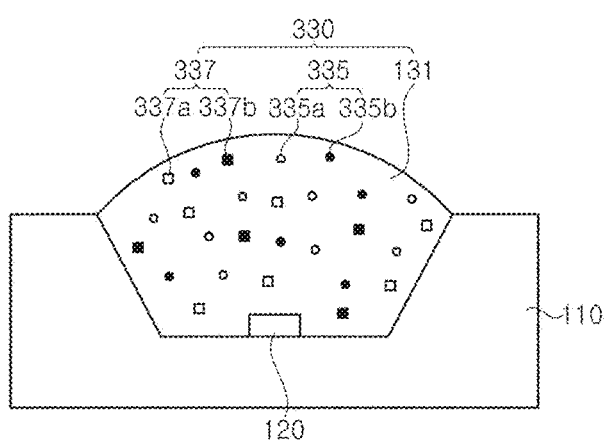
FIG. 3 is a sectional view of a light emitting device according to an embodiment of the present invention.

FIG. 3 is a sectional view of a light emitting device according to an embodiment of the present invention. The light emitting device of FIG. 3 is substantially the same as the light emitting device of FIG. 1 except for a wavelength conversion unit 330. The following description provides different features of the light emitting device according to this embodiment from those of the above embodiment, and detailed descriptions of the same features are omitted.

In this embodiment of the invention, the wavelength conversion unit 330 includes a containing portion 131, green phosphors 335 and red phosphors 337, in which the green phosphors 335 include first green phosphors 335a and second green phosphors 335b, and the red phosphors 337 include first red phosphors 337a and second red phosphors 337b.

The containing portion 131 can be formed of any material capable of containing the green phosphors 335 and the red phosphors 337, and can be transparent or translucent. The containing portion 131 can be formed of a polymer material including at least one selected from among, for example, a silicone resin, an epoxy resin, a polymethyl methacrylate (PMMA) resin, a polyethylene (PE) resin, and a polystyrene (PS) resin. Alternatively, the containing portion 131 can be formed of an inorganic material such as glass.

When the containing portion 131 is formed of a polymer material, the wavelength conversion unit 330 serves to convert the wavelength of light emitted from the light emitting diode while encapsulating the light emitting diode. In addition, although the wavelength conversion unit 330 is illustrated as having a convex lens-shaped upper surface in this embodiment as shown in FIG. 1, the present invention is not limited thereto.

The green phosphors 335 and the red phosphors 337 can be irregularly dispersed in the containing portion 131.

The green phosphors 335 can emit green light through excitation of light incident thereon and the red phosphors 337 can emit red light through excitation of light incident thereon. The white light emitting device 100 according to this embodiment can emit white light through combination of violet light emitted from the light emitting diode 120 with the green light excited by the green phosphors 335 and the red light excited by the red phosphors 337.

In this embodiment, the green phosphors 335 include the first green phosphors 335a and the second green phosphors 335b. The first green phosphors 335a can emit light having a peak wavelength in the range of 490 nm to 530 nm through excitation of light incident thereon, and the second green phosphors 335b can emit light having a peak wavelength in the range of 520 nm to 560 nm through excitation of light incident thereon. To this end, the green phosphors 335 can include LuAG-based phosphors (for example, $Lu_3Al_5O_{12}$:Ce), YAG-based phosphors (for example, $Y_3Al_5O_{12}$:Ce), and silicate-based phosphors. In one embodiment of the present invention, the first green phosphors 335a can include LuAG-based phosphors and the second green phosphors 335b can include silicate-based phosphors.

In this embodiment, the red phosphors 337 include the first red phosphors 337a and the second red phosphors 337b. The first red phosphors 337a can emit light having a peak wavelength in the range of 600 nm to 635 nm through excitation of light incident thereon, and the second red phosphors 337b can emit light having a peak wavelength in the range of 635 nm to 670 nm through excitation of light incident thereon. To this end, in this embodiment, the first red phosphors 337a can include nitride-based phosphors and the second red phosphors 337b can include sulfide phosphors. Alternatively, the first red phosphors 337a can include sulfide phosphors and the second red phosphors 337b can include nitride-based phosphors. Alternatively, both the first and second red phosphors 337a, 337b can include nitride-based phosphors. The nitride red phosphors can include CASN, CASSON, SCASN, and the like.

The light emitting device according to this embodiment can have a CRI of 70 or more, specifically a CRI of 90 or more and an R9 value of 50 or more.

For example, the first green phosphors 335a can include LuAG-based phosphors. The LuAG-based phosphors can include phosphors represented by $Lu_x(Al,Ga)_yO_z$:Ce. More specifically, the LuAG-based phosphors can include $Lu_3(Al,Ga)_5O_{12}$:Ce. The second green phosphors 335b can include silicate-based phosphors. The silicate-based phosphors can include phosphors represented by $(Ba,Sr,Ca)_xSiO_y$:Eu. More specifically, the silicate-based phosphors can include $(Ba,Sr,Ca)_2SiO_4$:Eu. The first red phosphors 337a can include phosphors represented by $(Sr,Ca)_xAl_ySi_zN_w$:Eu, and the second red phosphors 337b can include phosphors represented by $Ca_xAl_ySi_zN_y$:Eu. More specifically, the first red phosphors 337a can include phosphors represented by $(Sr,Ca)_1Al_1Si_1N_3$:Eu and the second red phosphors 337b can include phosphors represented by $Ca_1Al_1Si_1N_3$:Eu.

The mixing ratio of the green phosphors 335 to the red phosphors 337 can be adjusted such that the light emitting device according to this embodiment has a CRI of 90 or more and an R9 value of 50 or more. For example, the green phosphors 335 and the red phosphors 337 can be mixed in a mass ratio of (from 3 to 18):1 (green phosphors:red phosphors), specifically (from 6 to 13):1 (green phosphors: red phosphors). In some embodiments, the green phosphors 335 and the red phosphors 337 can be mixed in a mass ratio of 9.5:1 (green phosphors:red phosphors). In each of the green phosphors 335 and the red phosphors 337, the mixing ratio of the first and second phosphors can also be adjusted. For example, the phosphors can be mixed in a mass ratio of 9:1 (first green phosphors:second green phosphors), or 4:6 (first red phosphors:second red phosphors). It should be understood that the present invention is not limited thereto.

Experimental Example 5

An experiment for confirming temperature-related characteristics of the white light emitting device, which has the wavelength conversion unit 330 including the green phosphors 335 and the red phosphors 337, according to the above embodiment was performed. Various characteristics of a white light emitting device (Comparative Example 1) using LuAG-based phosphors alone as the green phosphors and a white light emitting device (Example 1) using LuAG-based phosphors as the first green phosphors and silicate-based phosphors as the second green phosphor were measured at room temperature (25° C.) and at 85° C. Each of the white light emitting devices has the same structure as that of the light emitting device described above.

TABLE 5

|  | Comparative Example 1 | | Example 1 | |
| --- | --- | --- | --- | --- |
| Temperature | 25° C. | 85° C. | 25° C. | 85° C. |
| VF (V) | 3.11 | 3.03 | 3.1 | 3.03 |
| Flux (lm) | 23.21 | 21.32 | 23.25 | 21.01 |
| Variation rate of Flux | 100.00% | 91.80% | 100.00% | 90.40% |
| CIE x | 0.459 | 0.455 | 0.451 | 0.445 |
| CIE y | 0.412 | 0.41 | 0.408 | 0.445 |
| CCT/K | 2725 | 2768 | 2815 | 2837 |
| Variation of CCT/K | 0 | 42.7 | 0 | 22 |
| CRI | 94 | 93.2 | 92.1 | 91.1 |
| Variation of CRI | 0 | −0.8 | 0 | −1 |
| R9 | 60.1 | 48.2 | 54.8 | 50 |
| Variation of R9 | 0 | −11.9 | 0 | −4.8 |

In Table 5, it can be seen that the light emitting device using the LuAG-based phosphors as the first green phosphors and the silicate-based phosphors as the second green phosphors (Example 1) does not undergo significant reduction of the R9 value at 85° C. as compared with the light emitting device using the LuAG-based green phosphors alone (Comparative Example 1). Thus, it can be confirmed that the light emitting device of Example 1 has a desired level of the R9 value even at 85° C. On the other hand, although the CRI of the light emitting device of Example 1 was decreased as compared with the light emitting device using the LuAG-based green phosphors alone, there was no problem since the light emitting device of Example 1 still had a CRI of 90 or more.

That is, although the light emitting device prepared using the light emitting diode emitting light having a peak wavelength in the range of 415 nm to 435 nm and the LuAG-based green phosphors alone satisfies a CRI of 90 or more, there is a problem of decrease of the R9 value to less than 50. However, when the green phosphors include the LuAG-based phosphors as the first green phosphors and the silicate-based phosphors as the second green phosphors, the light emitting device has a CRI of 90 or more and an R9 value of 50 or more.

Figure 5:
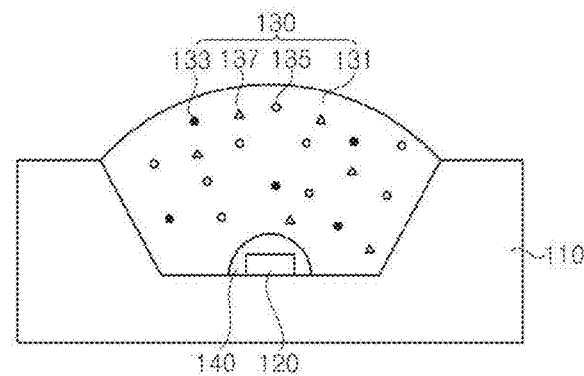
FIG. 5 to FIG. 9 are sectional views of light emitting devices according to embodiments of the present invention.

FIG. 5 is a sectional view of a light emitting device according to yet another embodiment of the present invention.

The light emitting device of FIG. 5 is substantially the same as the light emitting device of FIG. 1 except for a buffer section 140. The following description provides different features of the light emitting device according to this embodiment from those of the above embodiment, and detailed descriptions of the same features are omitted.

Referring to FIG. 5, the light emitting device includes the base 110, the light emitting diode 120, the wavelength conversion unit 130, and the buffer section 140.

The buffer section 140 can be disposed between the light emitting diode 120 and the wavelength conversion unit 130. As a result, the light emitting diode 120 can be separated from the wavelength conversion unit 130.

The buffer section 140 can be formed of a transparent or translucent insulation material, and can include a polymer material such as a silicone resin, an epoxy resin, PMMA, PE, PS, and the like. The buffer section 140 can protect the light emitting diode 120 from external environments and prevent the wavelength conversion unit 130 from being damaged due to heat generated upon operation of the light emitting diode 120.

In addition, the wavelength conversion unit 130 can have higher hardness than the buffer section 140. Thus, the light emitting diode 120 can be effectively protected by the wavelength conversion unit 130, which is placed to surround the light emitting diode and has relatively high hardness. In addition, the buffer section 140 adjoining the light emitting diode 120 has relatively low hardness and thus has a low likelihood of cracking. Accordingly, it is possible to more effectively prevent the light emitting diode 120 from being contaminated or damaged by external factors resulting from cracking of the buffer section 140.

Figure 6:
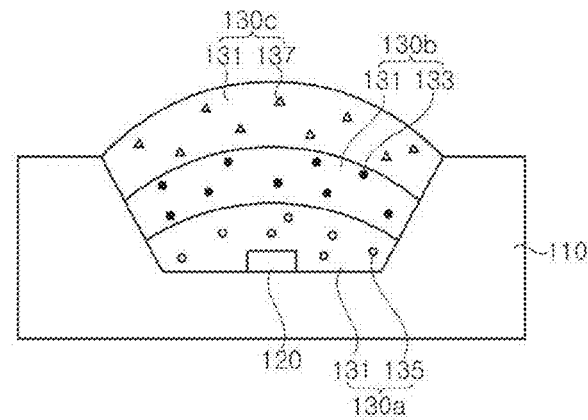

FIG. 6 is a sectional view of a light emitting device according to yet another embodiment of the present invention.

The light emitting device of FIG. 6 is substantially the same as the light emitting device of FIG. 1 except that a wavelength conversion unit 130 includes a first wavelength conversion unit 130a, a second wavelength conversion unit 130b, and a third wavelength conversion unit 130c. The following description provides different features of the light emitting device according to this embodiment from those of the above embodiment, and detailed descriptions of the same features are omitted.

Referring to FIG. 6, the light emitting device according to this embodiment includes a base 110, a light emitting diode 120, and the wavelength conversion unit 130. The wavelength conversion unit 130 can include the first wavelength conversion unit 130a, the second wavelength conversion unit 130b, and the third wavelength conversion unit 130c.

The first wavelength conversion unit 130a can include a containing portion 131 and red phosphors 135; the second wavelength conversion unit 130b can include a containing portion 131 and cyan phosphors 133; and the third wavelength conversion unit 130c can include a containing portion 131 and blue phosphors 137. In addition, the second wavelength conversion unit 130b can be disposed on the first wavelength conversion unit 130a and the third wavelength conversion unit 130c can be disposed on the second wavelength conversion unit 130b. Furthermore, light can enter the second wavelength conversion unit 130b after passing through the first wavelength conversion unit 130a, and can enter the third wavelength conversion unit 130c after passing through the first and second wavelength conversion units 130a, 130b.

As a result, upon operation of the light emitting device, light is excited by the red phosphors 135 while passing through the first wavelength conversion unit 130a, and the light having passed through the first wavelength conversion unit 130a is excited by the cyan phosphors 133 while passing through the second wavelength conversion unit 130b, then, the light having passed through the first and second wavelength conversion units 130a, 130b is excited by the blue phosphors 137 while passing through the third wavelength conversion unit 130c. That is, light subjected to wavelength conversion by the red phosphors 135 of the first wavelength conversion unit 130a has a longer wavelength than light subjected to wavelength conversion by the cyan phosphors 133 of the second wavelength conversion unit 130b, and the light subjected to wavelength conversion by the cyan phosphors 133 of the second wavelength conversion unit 130b has a longer wavelength than light subjected to wavelength conversion by the blue phosphors 137 of the fourth wavelength conversion unit 130c. Accordingly, it is possible to prevent light subjected to wavelength conversion by one type of phosphor from being absorbed into or lost by other types of phosphors.

The first wavelength conversion unit 130a can cover the light emitting diode 120; the second wavelength conversion unit 130b can cover the first wavelength conversion unit 130a; and the third wavelength conversion unit 130c can cover the second wavelength conversion unit 130b. The first to third wavelength conversion units 130a, 130b, 130c can be formed of materials having substantially the same hardness, or different hardness. The first wavelength conversion unit 130a can have lower hardness than the third wavelength conversion unit 130c, in which case, like the buffer section 140 in the embodiment of FIG. 2, the light emitting device can be prevented from being damaged by mechanical factors and heat generated from the light emitting diode 120.

Figure 7:
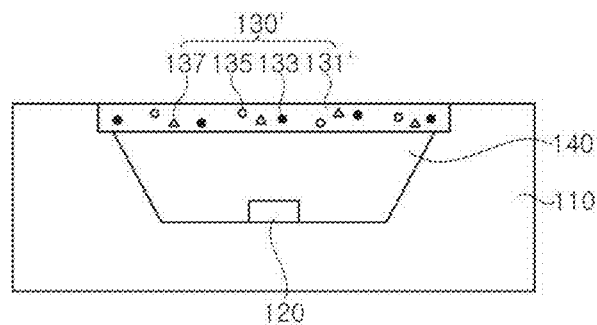

FIG. 7 is a sectional view of a light emitting device according to yet another embodiment of the present invention. The light emitting device of FIG. 7 is substantially the same as the light emitting device of FIG. 1 except that a wavelength conversion unit 130' is separated from a light emitting diode 120. The following description provides different features of the light emitting device according to this embodiment from those of the above embodiment, and detailed descriptions of the same features are omitted.

Referring to FIG. 7, the light emitting device according to this embodiment includes a base 110, the light emitting diode 120, and the wavelength conversion unit 130'. The light emitting device can further include a buffer section 140.

The wavelength conversion unit 130' is separated from the light emitting diode 120. In addition, the wavelength conversion unit 130' can have a plate shape and can include a containing portion 137 in which cyan phosphors 133, red phosphors 135 and blue phosphors 137 are irregularly dispersed. The plate-shaped wavelength conversion unit 130' can be separately prepared and disposed on the light emitting diode 120. Alternatively, the plate-shaped wavelength conversion unit 130' can be fabricated in the course of fabricating the light emitting device. In addition, the plate-shaped wavelength conversion unit 130' can be disposed on the light emitting diode 120 by bonding the plate-shaped wavelength conversion unit 130' to the base 110 in a state of being supported thereby.

On the other hand, a space between the light emitting diode 120 and the wavelength conversion unit 130' can be formed as a cavity, or can be filled with the buffer section 140.

Figure 8:
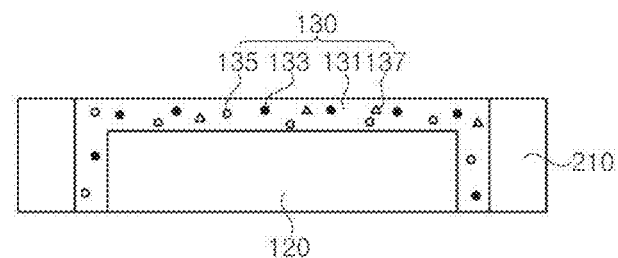
Figure 9:
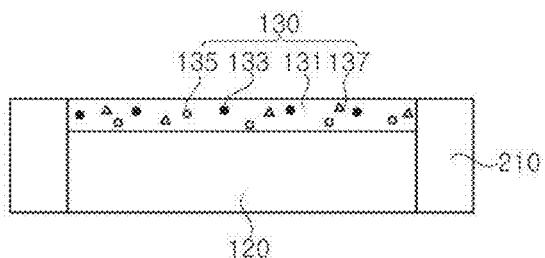

FIG. 8 and FIG. 9 are sectional views of light emitting devices according to other embodiments of the present invention. Hereinafter, the light emitting devices according to the embodiments of the present invention will be described, and detailed descriptions of the same features as those of the above embodiments will be omitted.

First, referring to FIG. 8, the light emitting device includes a light emitting diode 120, a wavelength conversion unit 130, and a resin section 210.

The light emitting diode 120 includes an upper surface and a lower surface, and particularly, can include electrode pads (not shown) disposed on the lower surface thereof. As the light emitting diode 120 includes the electrode pads disposed on the lower surface thereof, the light emitting device does not require separate electrodes and the electrode pads can serve as electrodes of the light emitting device.

As the light emitting diode 120, any device having electrode pads formed on a lower surface thereof and capable of emitting light can be used without limitation. For example, a flip-chip type light emitting diode can be used.

The wavelength conversion unit 130 can cover the upper surface and a side surface of the light emitting diode 120. The wavelength conversion unit 130 can have a constant thickness, but is not limited thereto. The upper surface and the side surface of the wavelength conversion unit 130 can have different thicknesses. For example, as shown in the drawings, the wavelength conversion unit 130 can be formed by conformal coating so as to have substantially the same thickness.

On the other hand, unlike the embodiment of FIG. 8, the wavelength conversion unit 130 can be formed to cover only the upper surface of the light emitting diode 120, as shown in FIG. 9. In this structure, the resin section 210 can adjoin the side surface of the light emitting diode 120.

Referring again to FIG. 8, the resin section 210 is disposed on a side surface of the light emitting diode 120 and can be formed to cover the wavelength conversion unit 130 disposed on the side surface of the light emitting diode 120. Accordingly, the wavelength conversion unit 130 covering the side surface of the light emitting diode 120 can be interposed between the light emitting diode 120 and the resin section 210. On the other hand, when the wavelength conversion unit 130 is disposed only on the side surface of the light emitting diode 120, the resin section 210 can adjoin the side surface of the light emitting diode 120 and the side surface of the wavelength conversion unit 130.

The resin section 210 can be formed to surround the light emitting diode 120 to support the light emitting diode 120 and the wavelength conversion unit 130 while protecting the light emitting diode 120 and the wavelength conversion unit 130 from external environments. In addition, an upper surface of the resin section 210 can be generally coplanar with the upper surface of the wavelength conversion unit 130.

The resin section 210 can be formed of a light-transmitting, translucent, or reflective material. An orientation angle of the light emitting device can be adjusted according to light transmittance of the resin section 210. The resin section 210 can include a polymer resin such as a silicone resin, an epoxy resin, a polyimide resin, a urethane resin, and the like, and can further include fillers, such as $TiO_2$, which can reflect or scatter light.

According to the embodiments described with reference to FIGS. 8 and 9, the light emitting diode 120 includes the electrode pads formed on the lower surface thereof and is supported by the resin section 210. With this structure, the light emitting device can eliminate a separate base and allows size reduction.

On the other hand, it should be understood that the structures of the light emitting devices described in FIGS. 5 to 9 can also be applied to the structure of the light emitting devices of the embodiments described in FIG. 2 and FIG. 3.

Figure 10:
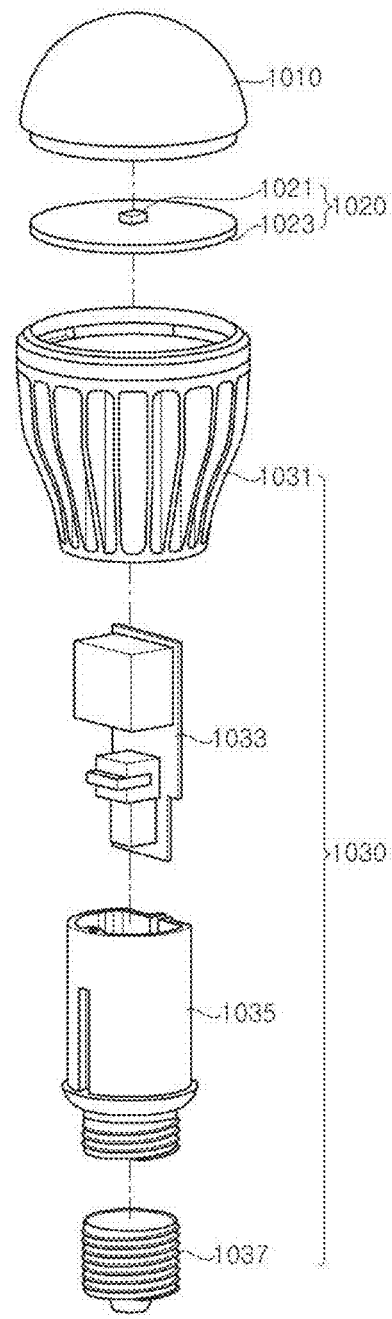
FIG. 10 is an exploded perspective view of one example of a lighting apparatus to which a light emitting device according to one embodiment of the present invention is applied.

FIG. 10 is an exploded perspective view of one example of a lighting apparatus to which a light emitting device according to one embodiment of the present invention is applied.

Referring to FIG. 10, the lighting apparatus according to this embodiment includes a diffusive cover 1010, a light emitting device module 1020, and a body 1030. The body 1030 can receive the light emitting device module 1020 and the diffusive cover 1010 can be disposed on the body 1030 to cover an upper portion of the light emitting device module 1020.

The body 1030 can have any shape so long as the body can supply electric power to the light emitting device module 1020 while receiving and supporting the light emitting device module 1020. For example, as shown in the drawing, the body 1030 can include a body case 1031, a power supply 1033, a power supply case 1035, and a power source connection section 1037.

The power supply 1033 is received in the power supply case 1035 to be electrically connected to the light emitting device module 1020, and can include at least one IC chip. The IC chip can regulate, change or control electric power supplied to the light emitting device module 1020. The power supply case 1035 can receive and support the power supply 1033. In addition, the power supply case 1035 having the power supply 1033 secured therein can be placed within the body case 1031. The power source connection section 115 is disposed at a lower end of the power supply case 1035 and coupled thereto. Accordingly, the power source connection section 115 is electrically connected to the power supply 1033 within the power supply case 1035 and can serve as a passage through which power can be supplied from an external power source to the power supply 1033.

The light emitting device module 1020 includes a substrate 1023 and a light emitting device 1021 disposed on the substrate 1023. The light emitting device module 1020 can be disposed at an upper portion of the body case 1031 and electrically connected to the power supply 1033.

As the substrate 1023, any substrate capable of supporting the light emitting device 1021 can be used without limitation. For example, the substrate 1023 can include a printed circuit board having interconnects formed thereon. The substrate 1023 can have a shape corresponding to a securing portion formed at the upper portion of the body case 1031 so as to be stably secured to the body case 1031. The light emitting device 1021 can include at least one of the light emitting devices according to the embodiments described above.

The diffusive cover 1010 is disposed on the light emitting device 1021 and can be secured to the body case 1031 to cover the light emitting device 1021. The diffusive cover 1010 can be formed of a light-transmitting material, and orientation characteristics of the lighting apparatus can be adjusted through regulation of the shape and light transmission of the diffusive cover 1010. As such, the diffusive cover 1010 can be modified in various shapes depending on utility and applications of the lighting apparatus.

According to this embodiment, a lighting apparatus having a high CRI and good luminous efficiency can be provided. In addition, the lighting apparatus has high reliability by minimizing deterioration of characteristic values, particularly, the CRI and the R9 value.

Figure 11:
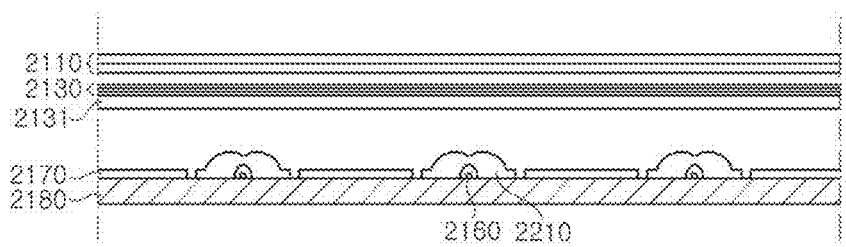
FIG. 11 is a sectional view of one example of a display device to which a light emitting device according to one embodiment of the present invention is applied.

FIG. 11 is a sectional view of one example of a display device to which a light emitting device according to one embodiment of the present invention is applied.

The display device according to this embodiment includes a display panel 2110, a backlight unit BLU1 supplying light to the display panel 2110, and a panel guide 2100 supporting the display panel 2110 at a lower edge thereof.

The display panel 2110 is not particularly limited and can be, for example, a liquid crystal panel including a liquid crystal layer. Gate driving PCBs can be further disposed at the edge of the display panel 2110 to supply driving signals to a gate line. Here, the gate driving PCBs 2112, 2113 can be formed on a thin film transistor substrate instead of being formed on separate PCBs.

The backlight unit BLU1 includes a light source module, which includes at least one substrate 2150 and a plurality of light emitting devices 2160. The backlight unit BLU1 can further include a bottom cover 2180, a reflective sheet 2170, a diffusive plate 2131, and optical sheets 2130.

The bottom cover 2180 can be open at an upper side thereof to receive the substrate 2150, the light emitting devices 2160, the reflective sheet 2170, the diffusive plate 2131, and the optical sheets 2130. In addition, the bottom cover 2180 can be coupled to the panel guide 2100. The substrate 2150 can be placed under the reflective sheet 2170 to be surrounded by the reflective sheet 2170. However, it should be understood that the present invention is not limited thereto. When a reflective material is coated onto a surface thereof, the substrate can be disposed on the reflective sheet 2170. Further, the light source module can include a plurality of substrates 2150, which can be arranged parallel to each other. However, it should be understood that the present invention is not limited thereto and the light source module can include a single substrate 2150.

The light emitting devices 2160 can include at least one of the light emitting devices according to the embodiments of the invention described above. The light emitting devices 2160 can be regularly arranged in a predetermined pattern on the substrate 2150. In addition, a lens 2210 is disposed on each of the light emitting devices 2160 to improve uniformity of light emitted from the plurality of light emitting devices 2160.

The diffusive plate 2131 and the optical sheets 2130 are disposed on the light emitting devices 2160. Light emitted from the light emitting devices 2160 can be supplied in the form of surface light to the display panel 2110 through the diffusive plate 2131 and the optical sheets 2130.

In this way, the light emitting devices according to the embodiments of the invention can be applied to a direct type display device like the display device according to this embodiment. According to this embodiment, the display device has a high CRI and high luminous efficiency. In addition, the display device has high reliability by minimizing deterioration of characteristic values, particularly, the CRI and the R9 value.

Figure 12:
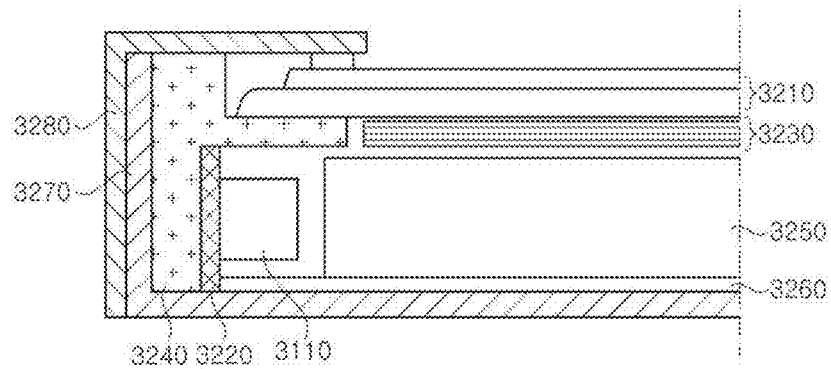
FIG. 12 is a sectional view of another example of a display device to which a light emitting device according to one embodiment of the present invention is applied.

FIG. 12 is a sectional view of another example of a display device to which a light emitting device according to one embodiment of the present invention is applied.

The display device according to this embodiment includes a display panel 3210 on which an image is displayed, and a backlight unit BLU2 disposed at a rear side of the display panel 3210 and emitting light thereto. Further, the display device includes a frame 240 supporting the display panel 3210 and receiving the backlight unit BLU2, and covers 3240, 3280 surrounding the display panel 3210.

The display panel 3210 is not particularly limited and can be, for example, a liquid crystal panel including a liquid crystal layer. A gate driving PCB can be further disposed at an edge of the display panel 3210 to supply driving signals to a gate line. Here, the gate driving PCB can be formed on a thin film transistor substrate instead of being formed on a separate PCB. The display panel 3210 is secured by the covers 3240, 3280 placed at upper and lower sides thereof, and the cover 3280 placed at the lower side of the display panel 3210 can be coupled to the backlight unit BLU2.

The backlight unit BLU2 supplying light to the display panel 3210 includes a lower cover 3270 partially open at an upper side thereof, a light source module disposed at one side inside the lower cover 3270, and a light guide plate 3250 placed parallel to the light source module and converting spot light into surface light. In addition, the backlight unit BLU2 according to this embodiment can further include optical sheets 3230 disposed on the light guide plate 3250 to spread and collect light, and a reflective sheet 3260 disposed at a lower side of the light guide plate 3250 and reflecting light traveling in a downward direction of the light guide plate 3250 towards the display panel 3210.

The light guide plate includes a substrate 3220 and a plurality of light emitting devices 3110 arranged at constant intervals on one surface of the substrate 3220. As the substrate 3220, any member capable of supporting the light emitting devices 3110 and being electrically connected thereto can be used without limitation. For example, the substrate 3220 can include a printed circuit board. The light emitting devices 3110 can include at least one of the light emitting devices according to the embodiments of the invention described above. Light emitted from the light source module enters the light guide plate 3250 and is supplied to the display panel 3210 through the optical sheets 3230. The light guide plate 3250 and the optical sheets 3230 convert spot light emitted from the light emitting devices 3110 into surface light.

In this way, the light emitting devices according to the embodiments of the invention can be applied to an edge type display device like the display device according to this embodiment. According to this embodiment, the display device has a high CRI and high luminous efficiency. In addition, the display device has high reliability by minimizing deterioration of characteristic values, particularly, the CRI and the R9 value.

It should be understood that the present invention is not limited to the embodiments and features described above, and various modifications and changes can be made without departing from the spirit and scope of the present invention, as set forth in the following claims.

The invention claimed is:

1. A light emitting device comprising:
a light emitting diode emitting light having a peak wavelength in the range of 415 nm to 435 nm; and
a wavelength conversion unit disposed over the light emitting diode, the wavelength conversion unit configured to convert a wavelength of the light emitted from the light emitting diode and emit the light with the converted wavelength,
wherein the wavelength conversion unit includes cyan phosphors emitting the light with the converted wavelength having a peak wavelength in a cyan light wavelength band and red phosphors emitting the light with the converted wavelength having a peak wavelength in a red light wavelength band, and
wherein the light emitting device is configured to emit an output light such that approximately equal to or less than 3% of the output light have a wavelength in the range of 435 nm to 465 nm.

2. The light emitting device of claim 1, wherein the cyan phosphors include at least one of LuAG, YAG, nitride, or silicate-based phosphors.

3. The light emitting device of claim 1, wherein the red phosphors include at least one of CASN, CASON, or SCASN phosphors.

4. The light emitting device of claim 1, wherein the cyan phosphors emit the light with the converted wavelength having a peak wavelength in the cyan light wavelength band including a range of 500 nm to 540 nm, and the red phosphors include first red phosphors emitting the light with the converted wavelength having a peak wavelength in the red light wavelength band including a range of 610 nm to 630 nm and second red phosphors emitting the light with the converted wavelength having a peak wavelength in the red light wavelength band including a range of 640 nm to 650 nm.

5. The light emitting device of claim 4, wherein the cyan phosphors include phosphors represented by $Lu_xAl_yO_z$:Ce, the first red phosphors include phosphors represented by $(Sr,Ca)_xAl_ySi_zN_w$:Eu, and the second red phosphors include phosphors represented by $Ca_xAl_ySi_zN_w$:Eu.

6. The light emitting device of claim 5, wherein the light emitting device emits the output light having a CRI of 90 or more, and a mass ratio of the cyan phosphors to the red phosphors in the wavelength conversion unit is (from 7 to 24):1 (cyan phosphors:red phosphors).

7. The light emitting device of claim 6, wherein, in the red phosphors, a mass ratio of the first red phosphor to the second red phosphor is (from 0.5 to 9):1 (first red phosphors: second red phosphor).

8. The light emitting device of claim 5, wherein the light emitting device emits light having a CRI of 95 or more, and a mass ratio of the cyan phosphors to the red phosphors in the wavelength conversion unit is (from 3 to 13):1 (cyan phosphors:red phosphors).

9. The light emitting device of claim 8, wherein, in the red phosphors, a mass ratio of the first red phosphors to the second red phosphors is 1:(from 2 to 4) (first red phosphors: second red phosphors).

10. The light emitting device of claim 5, wherein the cyan phosphors include phosphors represented by $Lu_3Al_5O_{12}$:Ce, the first red phosphors include phosphors represented by $(Sr,Ca)_1Al_1Si_1N_3$:Eu, and the second red phosphors include phosphors represented by $Ca_1Al_1Si_1N_3$:Eu.

11. The light emitting device of claim 1, wherein approximately equal to or less than 2% of the output light emitted by the light emitting device have a wavelength in the range of 435 nm to 465 nm.

12. The light emitting device of claim 1, wherein the wavelength conversion unit further includes blue phosphors emitting the light with the converted wavelength having a peak wavelength in a blue light wavelength band.

13. The light emitting device of claim 12, wherein the blue phosphors emit the light with the converted wavelength having a peak wavelength in the blue light wavelength band including a range of 450 nm to 480 nm, the cyan phosphors emit the light with the converted wavelength having a peak wavelength in the cyan light wavelength band including a range of 500 nm to 540 nm, and the red phosphors emit the light with the converted wavelength having a peak wavelength in the red light wavelength band including a range of 610 nm to 630 nm.

14. The light emitting device of claim 13, wherein the blue phosphors include phosphors represented by $(Sr,Ba)_x(PO_y)_zCl_w$:Eu, the cyan phosphors include phosphors represented by $Lu_xAl_yO_z$:Ce, and the red phosphors include phosphors represented by $(Sr,Ca)_xAl_ySi_zN_w$:Eu.

15. The light emitting device of claim 14, wherein the light emitting device emits the output light having a CRI of 90 or more, and the phosphors in the wavelength conversion unit have a mass ratio satisfying $((Sr,Ba)_x(PO_y)_zCl_w:Eu):(Lu_xAl_yO_z:Ce$ and/or $Lu_x(Al,Ga)_yO_z:Ce)):((Sr,Ca)_xAl_ySi_zN_w:Eu)$=(from 1 to 4):(from 6 to 9):(from 0.2 to 1).

16. The light emitting device of claim 14, wherein the light emitting device emits the light having a CRI of 95 or more, and the phosphors in the wavelength conversion unit have a mass ratio satisfying $((Sr,Ba)_x(PO_y)_zCl_w:Eu):((Lu_xAl_yO_z:Ce$ and/or $Lu_x(Al,Ga)_yO_z:Ce)):(Ca_xAl_ySi_z(ON)_w:Eu)$=(from 1 to 6):(from 2 to 7):(from 0.5 to 4).

17. The light emitting device of claim 14, wherein the blue phosphors include phosphors represented by $(Sr,Ba)_{10}(PO_4)_6Cl_2:Eu$, the cyan phosphors include phosphors represented by $Lu_3Al_5O_{12}:Ce$ and/or $Lu_3(Al,Ga)_5O_{12}:Ce$, and the red phosphors include phosphors represented by $Ca_1Al_1Si_1(ON)_3:Eu$.

* * * * *